US012077857B2

United States Patent
Jun et al.

(10) Patent No.: US 12,077,857 B2
(45) Date of Patent: Sep. 3, 2024

(54) TEMPERATURE CONTROL ASSEMBLY FOR SUBSTRATE PROCESSING APPARATUS AND METHOD OF USING SAME

(71) Applicant: ASM IP Holding B.V., Almere (NL)

(72) Inventors: SungHoon Jun, Hwaseong-si (KR); HeeChul Jung, Hwaseong-si (KR); YonJong Jeon, Yongin-si (KR)

(73) Assignee: ASM IP Holding B.V., Almere (NL)

( * ) Notice: Subject to any disclaimer, the term of this patent is extended or adjusted under 35 U.S.C. 154(b) by 0 days.

(21) Appl. No.: 18/222,024

(22) Filed: Jul. 14, 2023

(65) Prior Publication Data

US 2023/0357925 A1 Nov. 9, 2023

Related U.S. Application Data

(60) Continuation of application No. 17/835,082, filed on Jun. 8, 2022, now Pat. No. 11,746,414, which is a division of application No. 16/917,859, filed on Jun. 30, 2020, now Pat. No. 11,390,945.

(60) Provisional application No. 62/870,134, filed on Jul. 3, 2019.

(51) Int. Cl.
| | |
|---|---|
| *C23C 16/40* | (2006.01) |
| *C23C 16/44* | (2006.01) |
| *C23C 16/455* | (2006.01) |
| *C23C 16/50* | (2006.01) |
| *C23C 16/52* | (2006.01) |

(52) U.S. Cl.
CPC ........ *C23C 16/455* (2013.01); *C23C 16/4412* (2013.01); *C23C 16/45565* (2013.01); *C23C 16/50* (2013.01); *C23C 16/52* (2013.01)

(58) Field of Classification Search
CPC .............. C23C 16/455; C23C 16/4412; C23C 16/45565; C23C 16/50; C23C 16/52; C23C 16/45502; C23C 16/45519; C23C 16/4557; C23C 16/505; H01J 37/3244; H01J 37/32651; H01L 21/67017
USPC ................. 118/715; 156/345.33; 165/345.34
See application file for complete search history.

(56) References Cited

U.S. PATENT DOCUMENTS

| | | | |
|---|---|---|---|
| 9,017,481 B1 * | 4/2015 | Pettinger | H01J 37/32449 |
| | | | 118/724 |
| 2003/0132319 A1 | 7/2003 | Hytros et al. | |
| 2005/0205110 A1 | 9/2005 | Kao et al. | |
| 2005/0208217 A1 * | 9/2005 | Shinriki | H01J 37/32449 |
| | | | 156/345.33 |
| 2007/0026540 A1 * | 2/2007 | Nooten | C23C 16/45565 |
| | | | 438/758 |
| 2010/0132615 A1 | 6/2010 | Kato et al. | |
| 2011/0143551 A1 | 6/2011 | Borean et al. | |

(Continued)

FOREIGN PATENT DOCUMENTS

| | | |
|---|---|---|
| JP | 2009235470 A | 10/2009 |
| KR | 20080099200 A | 11/2008 |
| KR | 20190071294 A | 6/2019 |

*Primary Examiner* — Rudy Zervigon
(74) *Attorney, Agent, or Firm* — Snell & Wilmer L.L.P.

(57) ABSTRACT

Exemplary embodiments of the disclosure provide improved reactor systems, assemblies, and methods for controlling a temperature within the reactor system, such as a temperature of a gas supply unit. Exemplary systems and methods employ an exhaust unit to cause movement of a fluid over a portion of the gas supply unit to better control the temperature of the gas supply unit.

20 Claims, 9 Drawing Sheets

(56) References Cited

U.S. PATENT DOCUMENTS

| | | |
|---|---|---|
| 2012/0289057 A1 | 11/2012 | DeDontney |
| 2014/0103145 A1* | 4/2014 | White ............... C23C 16/45565 |
| | | 239/548 |
| 2016/0021707 A1 | 1/2016 | Ibrani |
| 2016/0265112 A1 | 9/2016 | Tolle et al. |
| 2017/0051402 A1 | 2/2017 | Mori |
| 2018/0171477 A1* | 6/2018 | Kim .................... H01J 37/3244 |
| 2020/0030766 A1* | 1/2020 | Lee ..................... C23C 16/4557 |

* cited by examiner (a)

(b)

(a)

(b)

(c)

TEMPERATURE CONTROL ASSEMBLY FOR SUBSTRATE PROCESSING APPARATUS AND METHOD OF USING SAME

CROSS-REFERENCE TO RELATED APPLICATIONS

This application is a continuation of, and claims priority to, U.S. patent application Ser. No. 17/835,082 filed Jun. 8, 2022 titled TEMPERATURE CONTROL ASSEMBLY FOR SUBSTRATE PROCESSING APPARATUS AND METHOD OF USING SAME; which is a divisional of U.S. patent application Ser. No. 16/917,859 filed Jun. 30, 2020 titled TEMPERATURE CONTROL ASSEMBLY FOR SUBSTRATE PROCESSING APPARATUS AND METHOD OF USING SAME; which claims the benefit of U.S. Provisional Patent Application Ser. No. 62/870,134, filed on Jul. 3, 2019, titled TEMPERATURE CONTROL ASSEMBLY FOR SUBSTRATE PROCESSING APPARATUS AND METHOD OF USING SAME, the disclosures of which are hereby incorporated by reference in their entirety.

FIELD OF INVENTION

The present disclosure generally relates to gas-phase apparatus, assemblies, systems, and methods. More particularly, the disclosure relates to apparatus, assemblies, and systems that include a gas supply unit and to methods of using the same.

BACKGROUND OF THE DISCLOSURE

Gas-phase reactors, such as chemical vapor deposition (CVD), plasma-enhanced CVD (PECVD), atomic layer deposition (ALD), and the like can be used for a variety of applications, including cleaning, depositing and etching materials on a substrate surface. For example, gas-phase reactors can be used to clean, deposit and/or etch layers on a substrate to form semiconductor devices, flat panel display devices, photovoltaic devices, microelectromechanical systems (MEMS), and the like.

A typical gas-phase reactor system includes a reactor including a reaction chamber, one or more precursor and/or reactant gas sources fluidly coupled to the reaction chamber, one or more carrier and/or purge gas sources fluidly coupled to the reaction chamber, a gas supply unit to distribute gas within the reaction chamber, and an exhaust source fluidly coupled to the reaction chamber.

FIG. 1(a) illustrates a cross-sectional view, taken along direction "A" in FIG. 1(b), of a reactor 100 including a gas supply unit 102. FIG. 1(b) illustrates a top view of gas supply unit 102. Reactor 100 also includes an RF rod 104, a gas curtain (GC) 106, a substrate support 108, an exhaust duct 110, a top lid 112, a flow control ring 114, a flow control ring mount 116, a heater 118, a gas inlet 120, a reaction space 122, an exhaust path 124, a gas flow channel 126, an insulator 128, a shield cover unit 130, and an insulator 132.

During operation of reactor 100, a gas is supplied to a substrate (not illustrated) mounted on substrate support 108 through gas inlet 120 to gas flow channel 126 to gas supply unit 102. Gas supply unit 102 can be a showerhead device, as illustrated. Gas curtain 106 is mounted on gas supply unit 102 and gas flow channel 126 is formed between gas curtain 106 and gas supply unit 102. A gas flow channel 126 provides a space to spread gas uniformly to gas supply unit 102. Gas flows into a reaction space 122 via a gas inlet 120, gas curtain 114 and a gas supply unit 102, and is exhausted to exhaust path 124 via a gap formed between exhaust duct 110 and flow control ring 114. A gas may be exhausted upwardly and/or downwardly, depending on a location of exhaust port (not illustrated).

Gas curtain 106 and a gas supply unit 102 are typically made of conducting materials, such as metal, and gas curtain 106 is directly mounted on gas supply unit 102. Insulator 128 is provided between gas supply unit 102 and a shield cover unit 130. Another insulator 132 is disposed between gas inlet 120 and gas curtain 106. Insulators 128 and 132 are made of non-conducting materials, e.g., ceramics, such as $Al_2O_3$, and prevent or mitigate RF power from leaking from gas supply unit 102 to shield cover unit 130 and to gas inlet 120. Shield cover unit 130 is placed at the top of reactor 100 to cover a recessed top portion of gas supply unit 102 and gas curtain 106. Shield cover unit 130 may be provided for the safety of workers during a plasma process. Shield cover unit 130 may be selectively attached to reactor 100 and detached from reactor 100. Shield cover unit 130 may include a metal-containing material. For example, shield cover unit 130 may include aluminum (Al). Shield cover unit 130 may prevent the diffusion of RF power to the atmosphere.

Substrate support 108 may be a heating block including heating elements therein. Heat from substrate support 108 can be radiated to gas supply unit 102 and to gas curtain 106, since gas supply unit 102 is formed of metal, gas curtain 106 is formed of metal, and gas curtain 106 is directly in contact with gas supply unit 102.

As illustrated in FIG. 1(b), gas supply unit 102 can include one or more RF rods 104 and/or heaters 118. RF rod 104 delivers RF power from an RF generator (not illustrated) to a gas supply unit 102. Gas supply unit 102, which can be metallic, can act as an electrode for plasma process. Heater 118 supplies heat to gas supply unit 102, and can be used to heat gas supply unit 102 to a set temperature. Heater 118 can be a rod-type heater or a cartridge heater to be inserted into a gas supply unit 102. As illustrated in FIG. 1(b), a plurality of RF rods 104 and heaters 118 can be provided for more uniform RF power delivery to gas supply unit 102 and heating of gas supply unit 102. At high temperature process, such as 550° C., for example, a temperature of gas supply unit 102 is heated by heaters 118 to a temperature lower than a decomposition temperature of source molecules—i.e., a precursor—for example, about 200° C. But, during processing, an actual temperature of gas supply unit 102 is often higher than a set temperature, because heat from a heating block 108 is radiated to a gas supply unit 102. A difference between set temperature and actual temperature of gas supply unit 102 can become more pronounced at higher process temperatures. As a result, source (e.g., precursor) molecules can undesirably decompose before they reach a substrate, leading to incomplete process or undesirable process results. The higher temperature also raises the risk of burn and fire and puts more thermal budget on chamber parts, leading to shorter lifetime of the parts. Accordingly, improved apparatus, assemblies, systems, and methods are desired. In particular, apparatus, assemblies, systems, and methods that provide improved temperature control, particularly for a gas supply unit, are desired.

Any discussion of problems and solutions set forth in this section has been included in this disclosure solely for the purposes of providing a context for the present disclosure, and should not be taken as an admission that any or all of the discussion was known at the time the invention was made.

SUMMARY OF THE DISCLOSURE

Various embodiments of the present disclosure relate to reactor systems, components thereof, and to methods of using the reactor systems and components. While the ways in which various embodiments of the present disclosure address drawbacks of prior methods and systems are discussed in more detail below, in general, exemplary embodiments of the disclosure provide improved systems, assemblies, and methods for controlling a temperature within the reactor system, such as a temperature of a gas supply unit.

In accordance with at least one embodiment of the disclosure, an assembly includes a gas supply unit, a gas curtain mounted on a gas supply unit, an insulator overlying the gas supply unit, a shield cover overlying the insulator, and an exhaust unit fluidly coupled to a region between the gas curtain and the shield cover. The assembly can further include a gas inlet that extends through a part of a stacked structure comprising the gas curtain and the shield cover. The gas inlet can include a first portion and a second portion, wherein the second portion comprises non-conductive material, and wherein the second portion is received by the gas curtain. The gas curtain can include a recessed portion and a plurality of pins arranged on the recessed portion. The pins can be in a variety of configurations and shapes, including column shaped and/or cylinder shaped. Additionally or alternatively, the pins can include a hollow space to provide additional surface area. The height of each of the pins can be such that the height does not extend beyond a top surface of the gas supply unit. A spacing between the plurality of pins can be substantially constant in a direction (e.g., radial direction) from a center of the recessed portion to a periphery of the recessed portion. The insulator can include a plurality of through holes in a lateral direction. The shield cover can include a plurality of holes in a vertical direction, a plurality of holes in a lateral direction, or both. The exhaust unit, such as a variable-speed fan, can exhaust fluid from a recessed portion of the gas curtain.

In accordance with at least one other embodiment of the disclosure, a method of controlling a temperature of an assembly, such as the assembly described above or elsewhere herein, is disclosed. An exemplary method includes providing an assembly and causing fluid to move over a surface of a gas curtain. The assembly can include a gas supply unit, the gas curtain mounted on a gas supply unit, an insulator overlying the gas supply unit, a shield cover overlying the insulator, and an exhaust unit connected to a part of the shield cover. The exhaust unit, such as a variable-speed fan, can be used to cause the fluid to move over the surface of the gas curtain—e.g., to provide convective cooling to the surface of the gas curtain. Exemplary methods can further include a step of measuring a temperature of the gas supply unit and/or a step of, using a controller, controlling power supplied to the exhaust unit and/or power supplied to one or more heaters within the assembly.

In accordance with additional embodiments of the disclosure, an assembly includes a gas supply unit; a gas curtain mounted on a gas supply unit, the gas curtain comprising a recessed portion comprising a plurality of pins thereon; an insulator, comprising a plurality of holes therethrough, overlying the gas supply unit; and a shield cover, comprising a plurality of holes therethrough, overlying the insulator. The assembly can include additional components, such as an exhaust unit as described herein.

These and other embodiments will become readily apparent to those skilled in the art from the following detailed description of certain embodiments having reference to the attached figures; the invention not being limited to any particular embodiment(s) disclosed.

BRIEF DESCRIPTION OF THE DRAWING FIGURES

A more complete understanding of exemplary embodiments of the present disclosure can be derived by referring to the detailed description and claims when considered in connection with the following illustrative figures.

FIG. 1 illustrates a gas-phase reactor of the prior art. FIG. 1(a) illustrates a cross-sectional view, taken along direction "A" of FIG. 1(b). FIG. 1(b) illustrates a top view of a gas supply unit of the gas-phase reactor.

Figure 1:
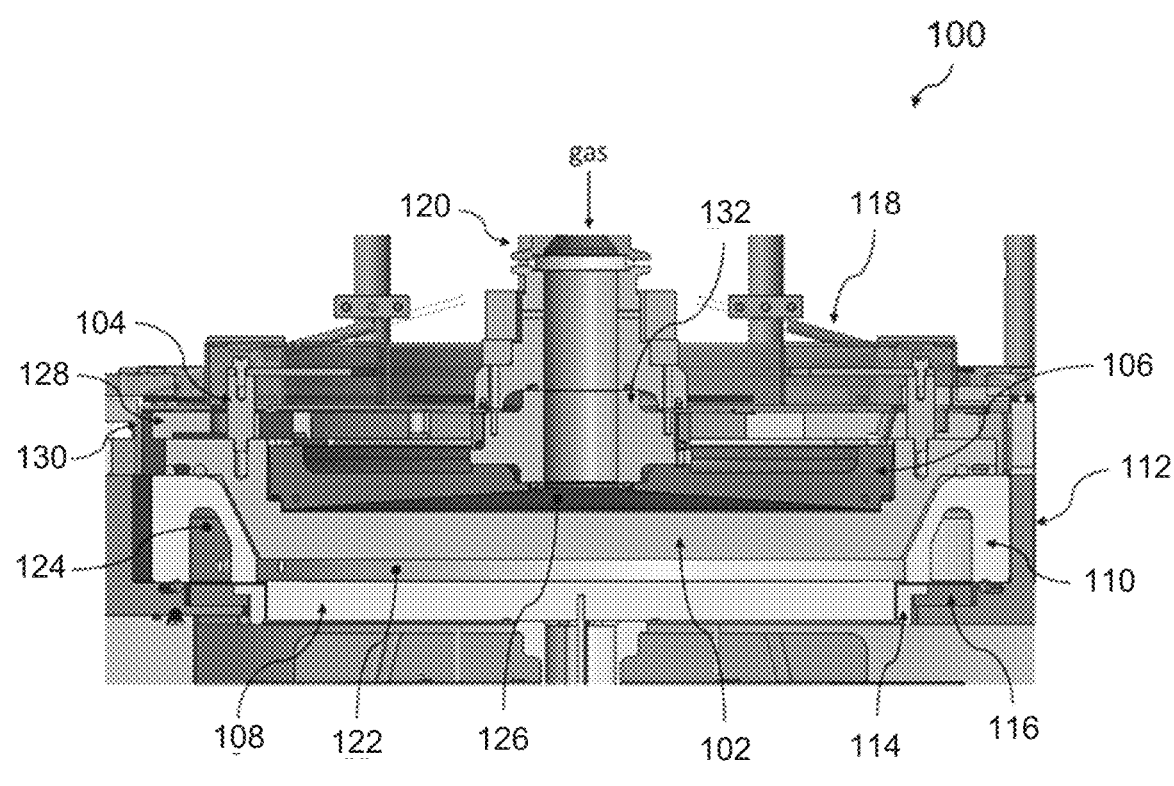
Figure 1:
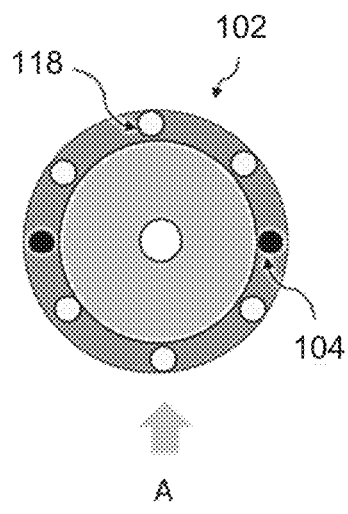

It will be appreciated that elements in the figures are illustrated for simplicity and clarity and have not necessarily been drawn to scale. For example, the dimensions of some of the elements in the figures may be exaggerated relative to other elements to help improve understanding of illustrated embodiments of the present disclosure.

DETAILED DESCRIPTION OF EXEMPLARY EMBODIMENTS

Although certain embodiments and examples are disclosed below, it will be understood by those in the art that the invention extends beyond the specifically disclosed embodiments and/or uses described herein and obvious modifications and equivalents thereof. Thus, it is intended that the scope of the invention disclosed should not be limited by the particular disclosed embodiments described below.

The present disclosure generally relates to apparatus, assemblies, and systems that include a gas supply unit and to methods of using same. As set forth in more detail below, exemplary systems, assemblies, apparatus, and methods described herein can be used to more accurately control a temperature of, for example, a gas supply unit, an assembly including the gas supply unit, a reaction chamber of a reactor including the assembly and/or various components of the assembly. The assembly can utilize fluid flow to more efficiently and more accurately control a temperature of the assemblies and components as described herein.

In this disclosure, "gas" can include material that is a gas at room temperature and pressure, a vaporized solid and/or a vaporized liquid, and may be constituted by a single gas or a mixture of gases, depending on the context. A gas other than the process gas, i.e., a gas introduced without passing through a gas supply unit, such as a showerhead, other gas distribution device, or the like, may be used for, e.g., sealing the reaction space, and can include a seal gas, such as a rare gas. A gas can be a reactant or precursor that takes part in a reaction within a reaction chamber and/or include ambient gas, such as air.

In this disclosure, "line" can refer to a conduit, such as a tube, through which gas flows. A line can include one or more valves, branches, or the like. Exemplary lines as described herein can be formed of stainless steel.

In this disclosure, any two numbers of a variable can constitute a workable range of the variable as the workable range can be determined based on routine work, and any ranges indicated may include or exclude the endpoints. Additionally, any values of variables indicated (regardless of whether they are indicated with "about" or not) may refer to precise values or approximate values and include equivalents, and may refer to average, median, representative, majority, etc. in some embodiments. Further, in this disclosure, the terms "constituted by," "including," "include," and "having" refer independently to "typically or broadly comprising," "comprising," "consisting essentially of," or "consisting of" in some embodiments. In this disclosure, any defined meanings do not necessarily exclude ordinary and customary meanings in some embodiments.

Figure 2:
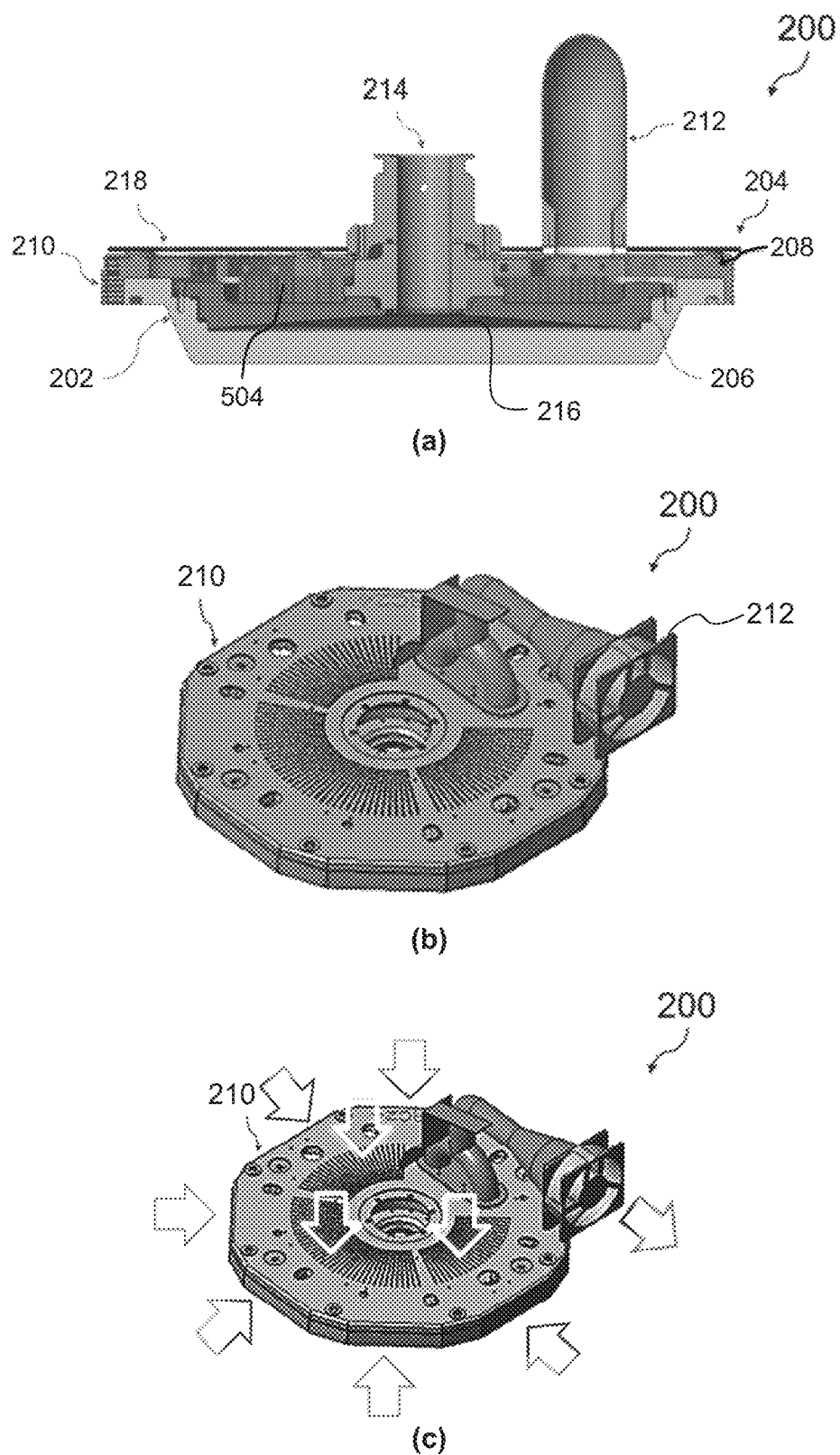
FIG. 2 illustrates an assembly in accordance with at least one embodiment of the disclosure.

Turning again to the figures, FIGS. 2, 6, 8 and 9 illustrate assembly 200 and 800 in accordance with at least one embodiment of the disclosure. FIG. 2(*a*) illustrates a cross sectional view of assembly 200, FIG. 2(*b*) illustrate a perspective view of assembly 200, and FIG. 2(*c*) illustrates fluid flow through assembly 200. Assembly 200 includes a gas supply unit 202 with a device 204 mounted thereon. In the illustrated example, device 204 includes a gas curtain 206, an insulator 208, a shield cover 210, an exhaust unit 212, and a gas inlet 214. Assemblies 200 and 800 can be the same or similar, except for pin configuration on gas curtain 206/806, as described below. Unless otherwise noted, gas curtain 206 can be replaced by gas curtain 806 and vice versa.

Gas inlet 214 receives gas from one or more gas sources fluidly coupled to gas inlet 214. Gas inlet 214 can be coupled to the gas sources using one or more lines, which may include various flow meters, mass flow controllers, valves, and the like. Gas inlet 214 can include a first portion 908 and a second portion 906 that is received by gas curtain 206. Second portion 906 can include or be formed of non-conductive material.

Gas supply unit 202 can be or include a showerhead gas distribution device. Gas supply unit 202 can receive gas from gas inlet 214 through a gas flow channel 216 formed between gas curtain 206 and gas supply unit 202. Gas supply unit 202 can include a plurality of holes extending between gas flow channel 216 and a reaction chamber to provide a desired distribution of gas to the reaction chamber and/or a surface of a substrate within the reaction chamber.

Figure 5:
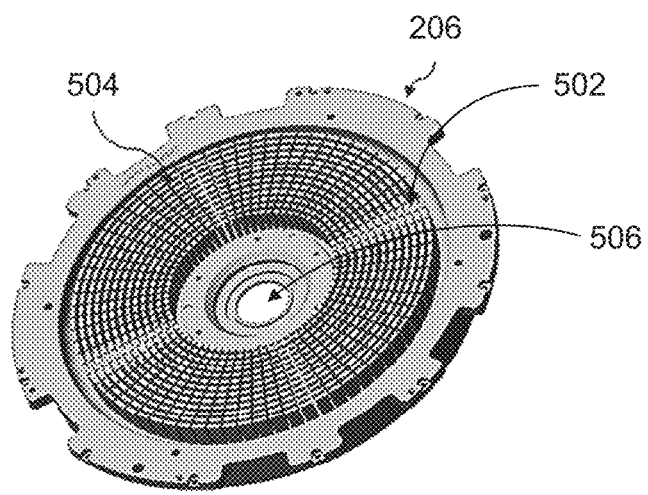
FIG. 5 illustrates a gas curtain and a pin arrangement in accordance with at least one embodiment of the disclosure.
Figure 5:
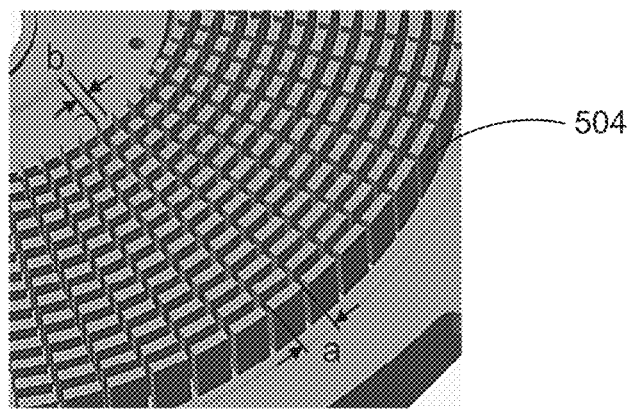
Figure 5:
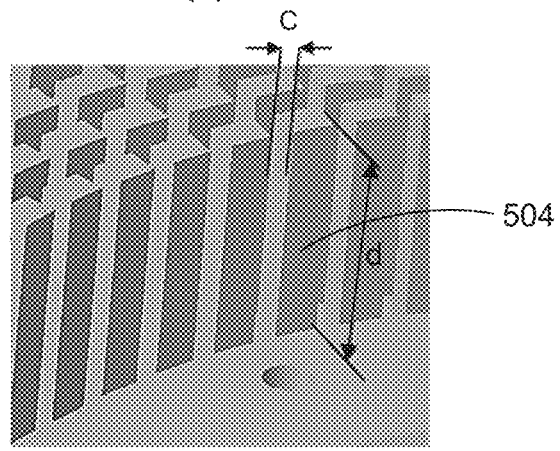

Gas curtain 206 is illustrated in greater detail in FIG. 5, where FIG. 5(*a*) illustrates a perspective view of gas curtain 206 and FIGS. 5(*b*) and 5(*c*) illustrate enlarged views of portions of gas curtain 206. As illustrated, gas curtain 206 includes a recessed portion 502. A plurality of pins 504 are arranged (e.g., mounted or integrally formed—e.g., by machining—to form an integral structure) on recessed portion 502.

Pins 504 can be arranged in recessed portion 502 using a variety of configurations. The type of pin arrangement can vary to, for example, increase the surface area contacting fluid, such as air, flowing onto gas curtain 206. That may improve heat exchange efficiency between pins 504 and the fluid. According to one example, pins 504 are spaced from about 1 mm to about 10 mm or about 2 mm apart from each other. Unless otherwise noted, other spacings are considered to be within the scope of this disclosure. For example, pins 504 can be spaced apart, so as to not disrupt or slow the fluid flow passing between them, or so as to keep the flow speed constant between pins. To keep the distance between pins 504 constant, a width of pins 504 may be shorter in a direction toward the center of gas curtain 206. For example, as shown in FIG. 5(*b*), a pin width a of a pin 504 located in outer portion is longer than a pin width b of a pin 504 located in inner portion, that is, a>b. In accordance with examples of the disclosure, a pin height "d" (FIG. 5(*c*)) is not higher than a top surface 902 of the gas supply unit 202, so that the shield cover 210 can tightly cover the gas supply unit 202. By way of particular example, a can be 10.2 mm, b can be 3.5 mm, c can be 2 mm and d can be 20 mm.

Figure 8:
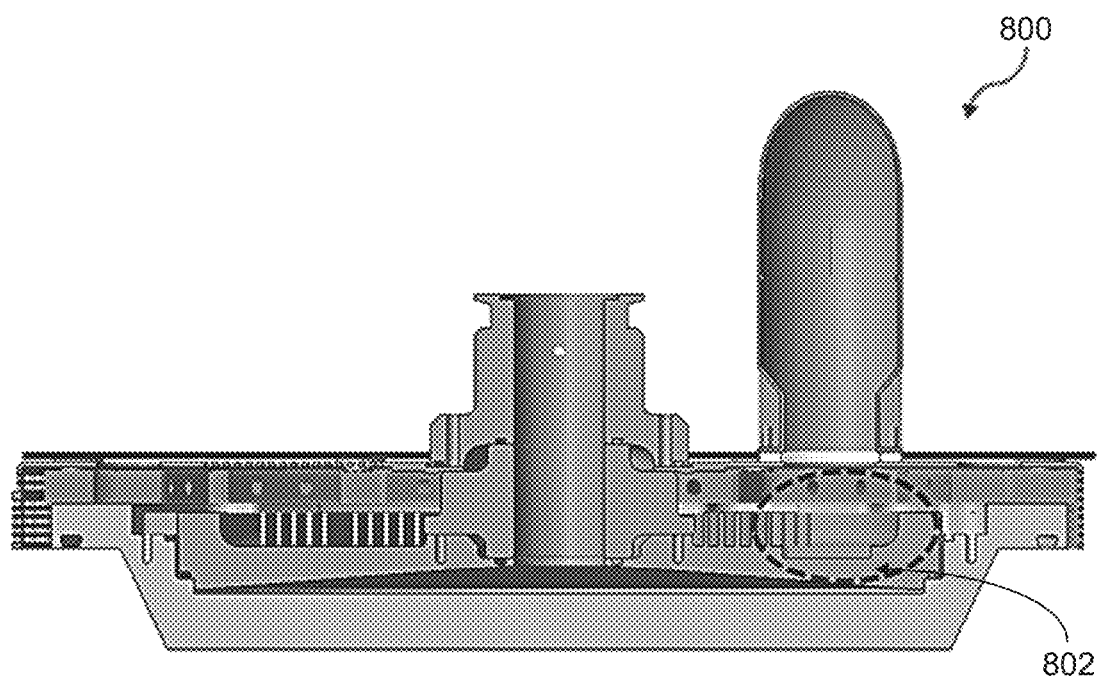
FIG. 8 illustrates another view of an assembly in accordance with embodiments of the disclosure.
Figure 9:
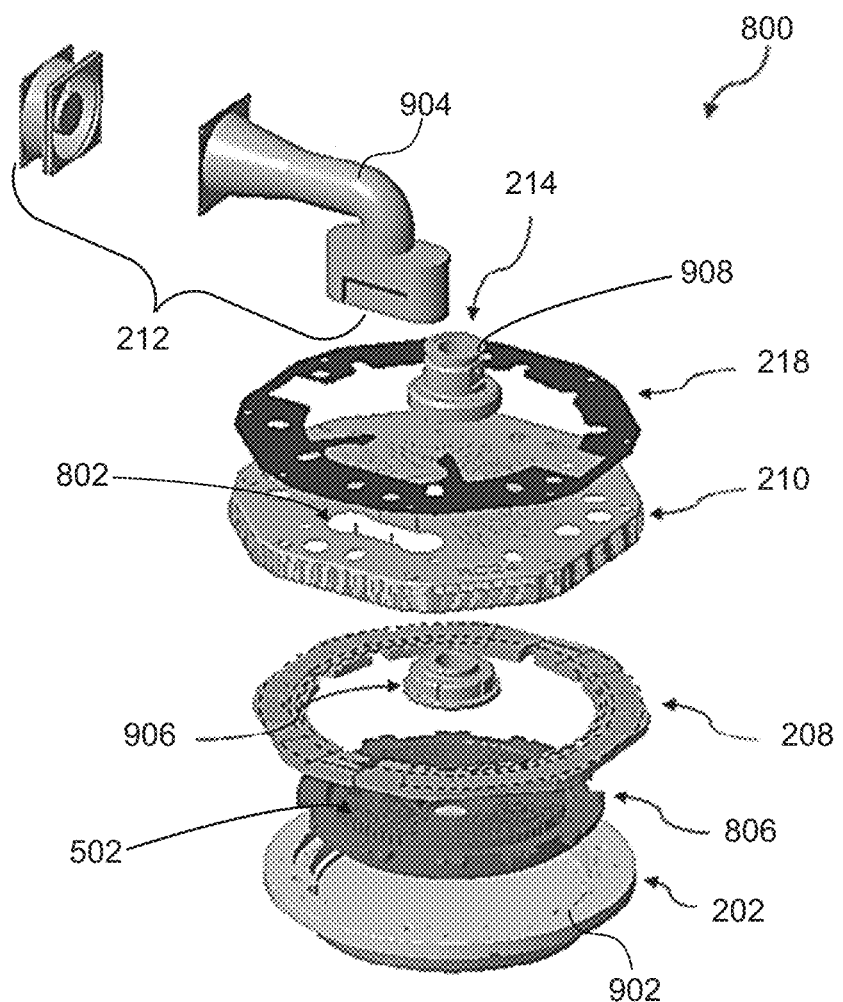
FIG. 9 illustrates an exploded view of an assembly in accordance with at least one embodiment of the disclosure.

In FIG. 5, a whole area of the recessed portion 502 of the gas curtain 206 is provided with pins 504. But in another embodiment, an area 802 under exhaust unit 212 may not be provided with pins 504, as illustrated in FIGS. 8 and 9. Not including pins in area 802 can facilitate smooth fluid flow to exhaust unit 212 by removing objects (namely, pins) that may otherwise interrupt smooth fluid flow near exhaust unit 212.

Figure 7:
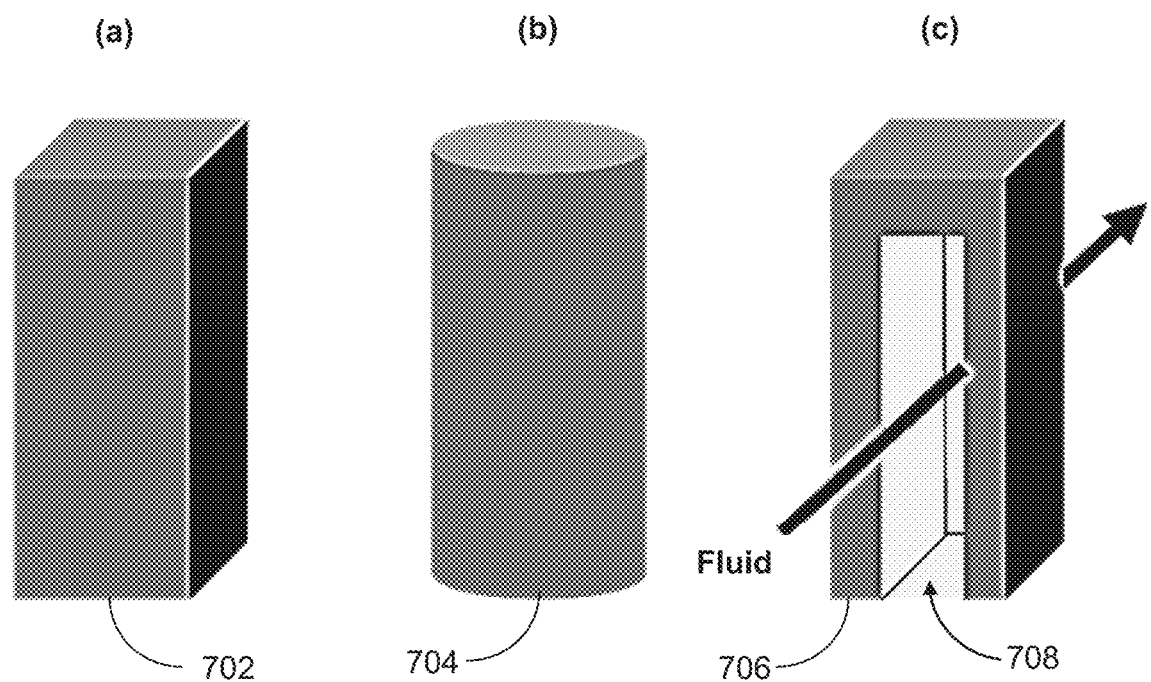
FIG. 7 illustrates exemplary pin configurations in accordance with embodiments of the disclosure.

FIG. 7 illustrates exemplary pins 702, 704, and 706, suitable for use as one or more of pins 504, where FIG. 7(*a*) illustrates pin 702 shaped as a rectangular prism, FIG. 7(*b*) illustrates pin 704 in the shape of a cylinder, and FIG. 7(*c*) illustrates pin 706 in the form of a rectangular prism with a hollow section 708. Hollow section 708 can increase a pin surface area in contact with the convecting fluid. Other pin shapes and pin configurations are contemplated by this disclosure.

A desired density of pin population and a desired distribution can vary according to application and can be determined experimentally.

As illustrated in FIG. 5, gas curtain 206 can also include a hole 506. Hole 506 can be configured to receive a portion of gas inlet 214.

Gas curtain 206 can be mounted on gas supply unit 202—e.g., mechanically coupled to gas supply unit 202—e.g., using fasters or by welding. Alternatively, gas curtain 206 can be a part of a gas supply unit 202—e.g., integrated with gas supply unit 202.

Figure 4:
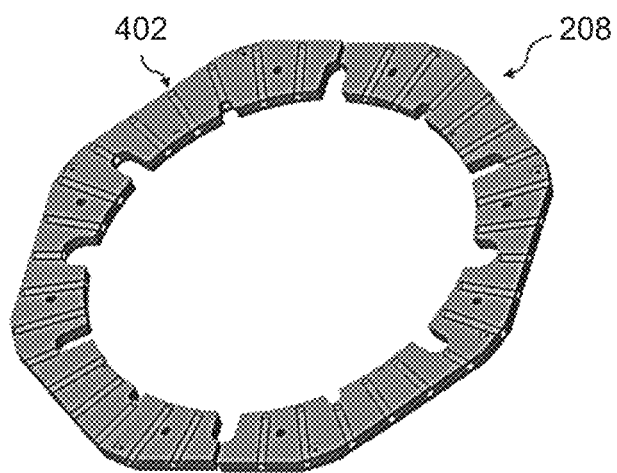
FIG. 4 illustrates an insulator in accordance with at least one embodiment of the disclosure.

Insulator 208, illustrated in greater detail in FIG. 4, is formed of non-conducting material, such as one or more ceramics, such as $Al_2O_3$. As illustrated, insulator 208 can include a plurality of through holes 402. The plurality of through holes 402 can be provided through insulator 208 in a lateral direction. Additionally, through holes 402 can be spaced at regular intervals through insulator 208. Insulator 208 can be about 10 to 15 mm in thickness. A cross-sectional dimension, such as a diameter, of the through holes can range from about 1 mm to about 12 mm or about 5 mm to about 10 mm or be about 7 mm. As illustrated in FIG. 4 and FIG. 9, through holes 402 connect recessed portion 502 of the gas curtain 206 with an outer space of a reactor in a lateral direction, and act as a pathway to flow fluid into recessed portion 502 of gas curtain 206.

As best illustrated in FIG. 9, insulator 208 is disposed between gas curtain 206/806 and shield cover 210. Insulator 208 prevents or mitigates RF power from leaking from the gas supply unit 202, which acts as an electrode, to the shield cover 210 and/or gas inlet 214.

Figure 3:
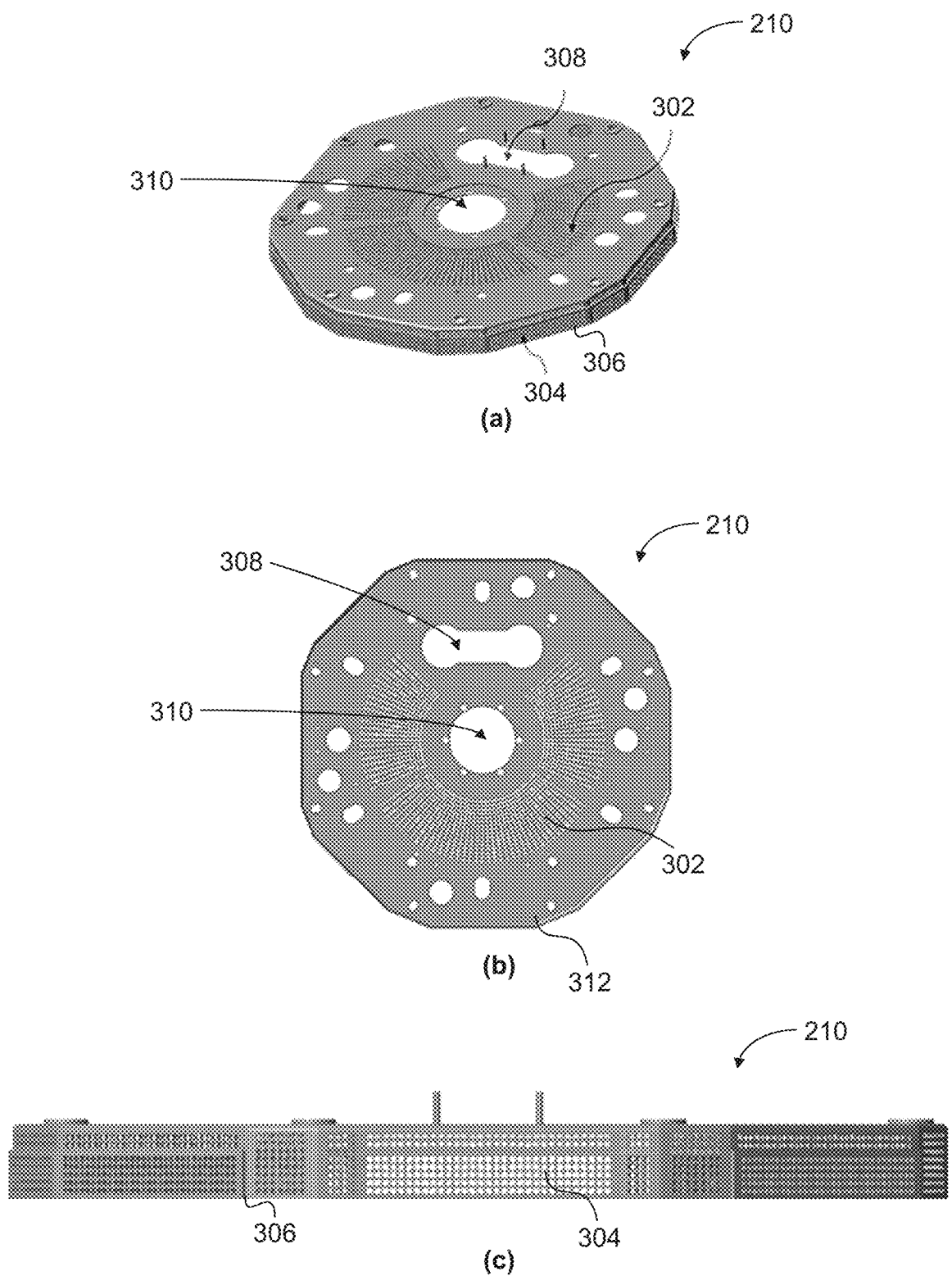
FIG. 3 illustrates a shield cover in accordance with at least one embodiment of the disclosure.

Shield cover 210 is best illustrated in FIG. 3, where FIG. 3(a) illustrates a perspective view, FIG. 3(b) illustrates a top view, and FIG. 3(c) illustrates a side view of shield cover 210. Shield cover 210 may be selectively attached to assembly 200 and detached from assembly 200. Shield cover 210 can be formed of or include a conducting—e.g., metal-containing material. For example, shield cover 210 may include aluminum (Al). Shield cover 210 is configured to shield RF power or to mitigate or to prevent the diffusion of RF power to the atmosphere.

As illustrated in FIG. 3, shield cover 210 includes a plurality of holes 302 through a top surface 312 and a plurality of holes 304 through one or more (e.g., all) side surfaces 306. Holes 302, 304 may be configured in a variety of shapes to allow fluid to pass efficiently through shield cover 210, while still mitigating or preventing RF radiation leakage. For example, holes 302, 304 may be mesh-shaped, as illustrated in FIG. 3. The hole size and shape may be configured not to degrade the RF shielding efficiency of the shield cover 210. For example, the hole 302,304 (e.g., a cross-sectional dimension of the hole) may be less than 5 mm in size, more preferably less than 3 mm in size.

Shield cover 210 also includes an exhaust port 308 that couples to an exhaust unit 212, described in more detail below. Shield cover 210 also includes an opening 310 to receive second portion 906 of gas inlet 214.

Exhaust unit 212 can include any suitable device for causing fluid to move. By way of examples, exhaust unit 212 can include a variable-speed fan. Exhaust unit 212 (e.g., a fan) may have a driving motor that is connected to an electric power source (not shown). Exhaust unit 212 can be coupled to a controller, which, in turn, can be coupled to one or more temperature sensors within assembly 200 and/or a reactor including assembly 200. The controller can be used to vary power supplied to exhaust unit 212 and/or heaters within assembly 200 to thereby further control a temperature of assembly 200, parts thereof, and/or the reactor.

Assembly 200 can also include an insulator 218 provided over shield cover 210. Insulator 218 can be provided for safety—e.g., to protect workers from the hot surface of the shield cover 210.

Exhaust unit 212 can be provided to the one side of shield cover 210. One side of the fan may be connected (e.g., using a duct 904, which can form part of exhaust unit 212) to the exhaust port 308 of the shield cover 210 and fluid in recessed portion 502 of the gas curtain 206 can be exhausted through exhaust port 308 to exhaust unit 212. Exhaust unit 212 generates a pressure difference between outside space and a recessed portion 502 of the gas curtain 206, so as to improve a heat exchange, suck and exhaust fluid in recessed portion 502 of gas curtain 206. An exhaust speed of the fluid can be controlled by controlling a rotating speed of exhaust unit 212. The rotating speed of exhaust unit 212 can determine the influx speed and amount of the fluid flowing into the recessed portion 502 of gas curtain 206 and the exhaust speed therefrom, so that a temperature of the gas supply unit 202, assembly 200, and/or other components thereof may be controlled more precisely.

As illustrated in FIGS. 2-5 and 9, gas curtain 206, insulator 208 and shield cover 210 define a flow channel within assembly 200. That is, gas curtain 206 defines a bottom side and a part of side wall of the flow channel, insulator 208 defines a part of side wall of the flow channel and shield cover 210 defines a top side of the flow channel.

Figure 6:
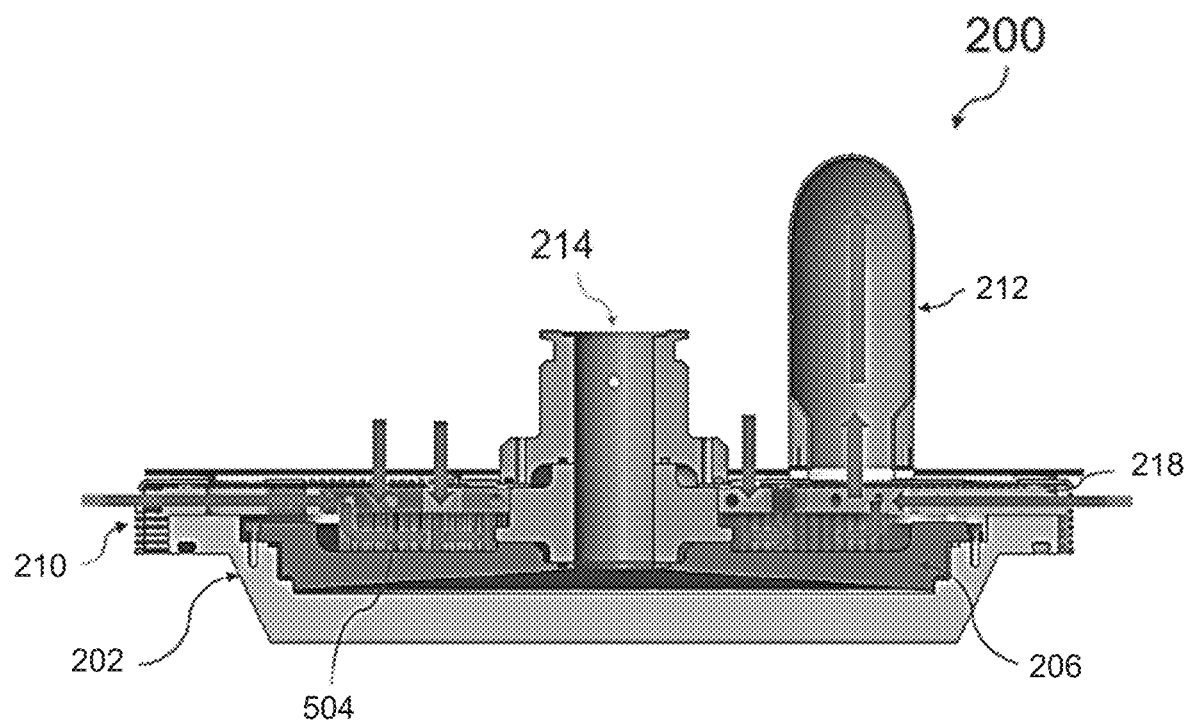
FIG. 6 illustrates fluid flow through an assembly in accordance with at least one embodiment of the disclosure.

FIG. 2(c) and FIG. 6 schematically illustrate flow of fluid into and out of assembly 200. As illustrated, fluid can be supplied onto the gas curtain 206 in a vertical direction and in a lateral direction simultaneously, and the fluid can be exhausted through exhaust unit 212.

In more detail, the fluid can flow through holes 302 and 304 of shield cover 210. The fluid can then flow through through holes 402 of insulator 208 into the recessed portion 502 of the gas curtain 206. That is, fluid can be supplied to the gas curtain 206 not only in a vertical direction through holes 302 formed on top surface 312 of shield cover 210, but also in a lateral direction through holes 304 formed on side surface 306 of the shield cover 210 and through holes 402 of the insulator 208 to supply fluid into the recessed portion 502 of the gas curtain 206 to increase heat exchange between the fluid and, for example, pins 504.

Table 1 below shows the temperature control over a gas supply unit, such as gas supply unit 202, at a high temperature of about 550° C., compared to a more traditional gas supply unit, such as gas supply unit 102. The data show that in the existing system (e.g., assembly 100) the temperature of the gas supply unit is above the set temperature, but in a system according to this disclosure, the temperature is appropriately controlled to meet the set/desired temperature.

TABLE 1 comparison of temperature control over the gas supply unit.

|  | Before | After | Set temp. of SHD (° C.) |
| --- | --- | --- | --- |
| Process temp (° C.) | 550 | 550 | 220 |
| Showerhead temp (° C.) | 225.4 | 220 |  |
| Showerhead heater power (%) | 0% | 45-48% |  |

For the data in Table 1, the test was carried out at a process temperature of 550° C. and the set temperature of the gas supply unit, e.g., showerhead, was 220° C. When an assembly according to the disclosure is not employed, a temperature of the gas supply unit (e.g., showerhead) is kept above the set temperature, though no electric power is provided to the (e.g., cartridge) heaters (showerhead heaters) inserted within the gas supply unit. But, when an assembly according to this disclosure is employed, the temperature of the gas supply unit is kept properly at the set temperature of 220° C., and just about 45% percent of electric power is provided to the heaters, which means there is enough room to control the temperature of the gas supply unit. For example, the temperature of the gas supply unit may be further lowered to or below 200° C.

As noted above, assembly 200 can form part of a reactor. The reactor can include any suitable gas-phase reactor. By way of examples, the reactor can be configured as a chemical vapor deposition reactor, an atomic layer deposition reactor, an etch reactor, a clean reactor, an epitaxial reactor, or the like. In some cases, the reactor can include a direct plasma configuration and/or a gas-phase reactor system can include a remote plasma unit coupled to the reactor.

The assembly, reactor, and components thereof as described herein include technical features and advantages over the existing art. Some examples are provided below.

A temperature of gas supply unit can be kept constant at set temperature at high temperature (e.g., greater than 400° C., greater than 500° C., or between about 400 and 600° C., or between about 450 and 550° C.) process and this makes a process stable. For example, an assembly as described herein can maintain a temperature of a gas supply unit at 220° C. or below 200° C. at a process temperature of 500° C. or more.

An assembly according to this disclosure makes a temperature control more effective and efficient compared to a typical gas supply unit by providing pins to a recessed portion of a gas curtain to increase a surface area of the assembly in contact with a convecting fluid. This design improves heat exchange efficiency between the gas curtain and the fluid.

An assembly according to this disclosure can make temperature control more effective and efficient compared to a typical assembly by introducing fluid influx holes to the top side and the side wall of a shield cover. This design increases the hole density and the influx rate of the fluid.

An assembly according to this disclosure can make a temperature control more effective and efficient over a typical assembly by introducing an insulator between a gas curtain and a shield cover. A plurality of holes is provided through the insulator body in a lateral direction, and an inner space and an outer space of the gas curtain are communicated with each other through the through holes. Fluid can be supplied to the pins arranged in the recessed portion of the gas curtain through holes on the side wall of the shield cover and through the through-holes formed within the insulator.

An assembly according to this disclosure can make temperature control more effective and efficient compared to a typical assembly by introducing a fan to the shield cover. The fan exhausts fluid in the gas curtain and facilitates fast heat exchange between a gas curtain and a convecting fluid.

The example embodiments of the disclosure described above do not limit the scope of the invention, since these embodiments are merely examples of the embodiments of the invention. Any equivalent embodiments are intended to be within the scope of this invention. Indeed, various modifications of the disclosure, in addition to those shown and described herein, such as alternative useful combinations of the elements described, may become apparent to those skilled in the art from the description. Such modifications and embodiments are also intended to fall within the scope of the appended claims.

What is claimed is:

1. An assembly comprising: a gas supply unit; a gas curtain mounted on the gas supply unit, wherein the gas curtain comprises a recessed portion and a plurality of pins arranged on the recessed portion; wherein at least one of the plurality of pins comprises a hollow space; an insulator overlying the gas supply unit; a shield cover overlying the insulator; and an exhaust unit connected to a part of the shield cover.

2. The assembly of claim 1, wherein the exhaust unit fluidly couples to a region between the gas curtain and the shield cover.

3. The assembly of claim 1, wherein the exhaust unit comprises a variable-speed fan.

4. The assembly of claim 1, further comprising a controller configured to control power supplied to the exhaust unit.

5. The assembly of claim 1, further comprising a thermal insulator overlying at least a portion of the shield cover.

6. The assembly of claim 1, wherein the shield cover comprises a plurality of holes in a vertical direction, a plurality of holes in a lateral direction, or both.

7. The assembly of claim 6, wherein a cross-sectional dimension of at least one of plurality of holes is less than 5 mm in size.

8. The assembly of claim 6, wherein a cross-sectional dimension of at least one of plurality of through holes is less than 3 mm in size.

9. The assembly of claim 1, wherein the insulator includes a plurality of through holes.

10. The assembly of claim 9, a cross-sectional dimension of the through holes is about 1 mm to 12 mm.

11. The assembly of claim 10, wherein a thickness of the insulator is about 10 mm to about 15 mm.

12. The assembly of claim 1, wherein a width of pins of the plurality of pins is shorter in a direction toward a center of gas curtain.

13. The assembly of claim 1, wherein area of the gas curtain under the exhaust unit does not include pins of the plurality of pins.

14. The assembly of claim 1, wherein a shape of each of the plurality of pins is a rectangular prism.

15. The assembly of claim 1, wherein the insulator comprises a ceramic.

16. The assembly of claim 1, wherein the shield cover comprises metal-containing material.

17. The assembly of claim 1, wherein the shield cover comprises a plurality of holes through a top surface of the shield cover.

18. The assembly of claim 1, wherein the shield cover comprises a plurality of holes through a side surface of the shield cover.

19. The assembly of claim 1, wherein the shield cover comprises an exhaust port that couples to the exhaust unit.

20. The assembly of claim 1, further comprising a gas inlet that extends through a part of a stacked structure comprising the gas curtain and the shield cover.

* * * * *